(12) United States Patent
Yang et al.

(10) Patent No.: US 11,676,548 B2
(45) Date of Patent: Jun. 13, 2023

(54) LIGHT SOURCE UNIT, BACKLIGHT MODULE AND DISPLAY DEVICE

(71) Applicant: SHENZHEN TCL NEW TECHNOLOGY CO., LTD., Shenzhen (CN)

(72) Inventors: Minna Yang, Shenzhen (CN); Jianlin Li, Shenzhen (CN)

(73) Assignee: Shenzhen TCL New Technology Co., Ltd., Shenzhen (CN)

(*) Notice: Subject to any disclaimer, the term of this patent is extended or adjusted under 35 U.S.C. 154(b) by 314 days.

(21) Appl. No.: 17/258,046

(22) PCT Filed: Aug. 20, 2019

(86) PCT No.: PCT/CN2019/101640
§ 371 (c)(1),
(2) Date: Jan. 5, 2021

(87) PCT Pub. No.: WO2021/031124
PCT Pub. Date: Feb. 25, 2021

(65) Prior Publication Data
US 2022/0051635 A1    Feb. 17, 2022

(51) Int. Cl.
*G09G 3/20* (2006.01)
*G09G 3/34* (2006.01)
(Continued)

(52) U.S. Cl.
CPC ......... *G09G 3/3413* (2013.01); *G09G 3/3426* (2013.01); *H01L 25/0753* (2013.01);
(Continued)

(58) Field of Classification Search
CPC ................ G09G 3/3413; G09G 3/3426; H01L 25/0753; H01L 33/483; H01L 33/504;
(Continued)

(56) References Cited

U.S. PATENT DOCUMENTS

2008/0309593 A1* 12/2008 Ito .................... G02F 1/133603
  345/76
2009/0078852 A1    3/2009 Lin et al.
(Continued)

FOREIGN PATENT DOCUMENTS

| CN | 101101403 A | 1/2008 |
|----|----|----|
| CN | 102770798 A | 11/2012 |
| CN | 209086609 U | 7/2019 |
| CN | 209086610 U | 7/2019 |
| JP | 2010262900 A | 11/2010 |

OTHER PUBLICATIONS

The World Intellectual Property Organization (WIPO) International Search Report for PCT/CN2019/101640 dated May 20, 2020 11 Pages (including translation).

*Primary Examiner* — Thuy N Pardo
(74) *Attorney, Agent, or Firm* — Nathan & Associates; Menachem Nathan

(57) ABSTRACT

The disclosure discloses a light source unit, a backlight module and a display device, wherein the light source unit comprises a printed circuit board and a plurality of light source groups, the plurality of light source groups are arranged on the printed circuit board, and each light source group at least comprises a red light source, a green light source and a blue light source; the plurality of light source groups are divided into a plurality of regions, and each region is independently controlled. According to the disclosure, the light source groups are divided into regions, and the display signals of the light source groups in each region are controlled through independent control switches, so that the backlight LED light source can be lighted regionally in high brightness and high color gamut region, and the energy consumption is reduced.

10 Claims, 2 Drawing Sheets

(51) Int. Cl.
*H01L 25/075* (2006.01)
*H01L 33/48* (2010.01)
*H01L 33/50* (2010.01)
*H01L 33/58* (2010.01)

(52) U.S. Cl.
CPC .......... *H01L 33/483* (2013.01); *H01L 33/504* (2013.01); *H01L 33/58* (2013.01)

(58) Field of Classification Search
CPC . H01L 33/58; H01L 33/502; G02F 1/133601; G02F 1/133603
USPC .................................... 345/55, 76, 291, 102

See application file for complete search history.

(56) References Cited

U.S. PATENT DOCUMENTS

| | | | |
|---|---|---|---|
| 2009/0256494 A1* | 10/2009 | Nishinaka | H01L 33/06 315/291 |
| 2017/0011670 A1* | 1/2017 | van de Ven | H05B 45/22 |
| 2017/0111972 A1* | 4/2017 | Oepts | H01L 25/0753 |
| 2017/0256209 A1* | 9/2017 | Kang | G09G 3/3413 |
| 2018/0052274 A1* | 2/2018 | Nichol | G02B 6/0028 |
| 2018/0160504 A1* | 6/2018 | van de Ven | F21V 5/04 |
| 2020/0134773 A1* | 4/2020 | Pinter | G01N 21/8806 |
| 2021/0113167 A1* | 4/2021 | Chui | G06F 18/254 |
| 2021/0190481 A1* | 6/2021 | Kakkar | H01L 33/30 |
| 2021/0265323 A1* | 8/2021 | Halbritter | H01L 25/167 |
| 2022/0118274 A1* | 4/2022 | Brawn | A61N 5/0616 |

* cited by examiner

LIGHT SOURCE UNIT, BACKLIGHT MODULE AND DISPLAY DEVICE

CROSS-REFERENCES TO RELATED APPLICATIONS

This application is a national stage application of PCT Patent Application No. PCT/CN2019/101640, filed on Aug. 20, 2019, the content of all of which is incorporated herein by reference.

FIELD OF THE INVENTION

The disclosure relates to the technical field of LED display, in particular to a light source unit, a backlight module and a display device.

BACKGROUND

At present, HDR (High Dynamic Range) high dynamic range technology has been used more and more in the field of liquid crystal display technology, and high brightness and high color gamut technology have become the research hotspot in the display industry. The high brightness enables a picture displayed by the display equipment to have a brightness detail level. For high-brightness pictures, such as light reflection of the glass under sunlight, fireworks in the night sky and the like, in the display picture, it is generally not the highlight of the entire display picture, but the ultra-high brightness in a short time and a small area. In order to achieve this effect, the backlight design generally takes into account the partitioning of the entire light source scheme, i.e. the Local Dimming technology. The combination of high brightness and high color gamut can display more perfect colors, because the high color gamut display technology has the characteristics of wide color quantity, high color saturation, more vivid color than ordinary color gamut television, and beautiful picture quality. If a high-lighted picture appears on display equipment with a low color gamut, the phenomena of picture color whitening, color distortion and unclear detail color can occur.

Accordingly, the prior art has yet to be improved and developed.

BRIEF SUMMARY OF THE DISCLOSURE

Given the above-mentioned shortcomings of the prior art, in order to solve the shortcomings and disadvantages of the prior art, the present disclosure proposes a light source unit, a backlight module, and a display device. The backlight module can combine with Local Dimming technology to solve the problem of color distortion and low color reproduction under high-brightness pictures.

The technical scheme adopted by the disclosure for solving the technical problem is as follows.

A light source unit, comprising a printed circuit board and a plurality of light source groups, wherein the plurality of light source groups are arranged on the printed circuit board, and each light source group at least comprises a red light source, a green light source and a blue light source; the plurality of light source groups are divided into a plurality of regions, and each region is independently controlled.

In the light source unit, each region includes at least one the red light source, one the green light source, and one the blue light source.

In the light source unit, the red light source is a red light LED chip, the green light source is a green light LED chip, and the blue light source is a blue light LED chip; the red light LED chip, the green light LED chip and the blue light LED chip are packaged into a whole to form one the light source group.

In the light source unit, the red light LED chip, the green light LED chip and the blue light LED chip are respectively provided with independent control switches.

In the light source unit, the red light source comprises a red light LED chip and a first packaging structure for packaging the red light LED chip; the green light source comprises a green light LED chip and a second packaging structure for packaging the green light LED chip; the blue light source comprises a blue light LED chip and a third packaging structure for packaging the blue light LED chip, and one the red light source, one the green light source and one the blue light source form one the light source group.

In the light source unit, the red light source comprises a blue light LED chip and a first packaging structure for packaging the blue light LED chip, and the first packaging structure is used for converting blue light emitted by the blue light LED chip into red light; the green light source comprises a blue light LED chip and a second packaging structure for packaging the blue light LED chip, and the second packaging structure is used for converting blue light emitted by the blue light LED chip into green light; the blue light source comprises a blue light LED chip and a third packaging structure for packaging the blue light LED chip, one the red light source, one the green light source and one the blue light source form one the light source group.

In the light source unit, the red light source comprises an ultraviolet light LED chip and a first packaging structure for packaging the ultraviolet light LED chip, and the first packaging structure is used for converting light emitted by the ultraviolet light LED chip into red light; the green light source comprises an ultraviolet light LED chip and a second packaging structure for packaging the ultraviolet light LED chip, and the second packaging structure is used for converting light emitted by the ultraviolet light LED chip into green light; the blue light source comprises an ultraviolet light LED chip and a third packaging structure for packaging the ultraviolet light LED chip, and the third packaging structure is used for converting light emitted by the ultraviolet light LED chip into blue light; one the red light source, one the green light source and one the blue light source form one the light source group.

In the light source unit, the red light source, the green light source and the blue light source are provided with independent control switches.

In the light source unit, the first packaging structure comprises a red light quantum dot material; the second packaging structure comprises a green light quantum dot material; the third packaging structure comprises a blue light quantum dot material; the red light quantum dot material, the green light quantum dot material and the blue light quantum dot material are independently selected from one of indium phosphide quantum dot, indium arsenide quantum dot, gallium arsenide quantum dot, zinc sulfide quantum dot, zinc selenide quantum dot or perovskite quantum dot materials.

In the light source unit, the red light source, the green light source and the blue light source are sequentially arranged on the printed circuit board at intervals.

In the light source unit, the first packaging structure further comprises a first packaging lens; the second packaging structure further comprises a second packaging lens; the third packaging structure further comprises a third packaging lens.

In the light source unit, the light source unit further comprises a white light source disposed on the printed circuit board between the light source groups.

In the light source unit, the white light source comprises an LED chip and a fourth packaging structure for packaging the LED chip, wherein the fourth packaging structure comprises a fourth packaging lens and a light conversion layer, and the fourth packaging structure is used for converting light emitted by the LED chip into white light; the LED chip of the white light source is a blue light LED chip or an ultraviolet light LED chip.

A backlight module comprises a back plate and the light source unit, wherein the light source unit is arranged on the back plate.

A display device comprises a display panel and the backlight module.

Compared with the prior art where LED (Light Emitting Diode) white light is adopted as a backlight, the backlight module provided by the disclosure adopts a light source unit as a backlight, wherein the light source unit comprises a printed circuit board and a plurality of light source groups arranged on the printed circuit board, each light source group at least comprises a red light source, a green light source and a blue light source; the plurality of light source groups are divided into a plurality of regions, and each region is independently controlled. According to the disclosure, a plurality of light source groups are divided into a plurality of regions, and the regions are independently controlled, so that a color Local Dimming effect is realized, a backlight LED light source can be lighted regionally when high brightness and high color saturation are needed, and the energy consumption can be greatly reduced compared with a traditional LED white light full white field high brightness scheme.

DETAILED DESCRIPTION OF EMBODIMENTS

In order to make the object, technical solutions and advantages of the present disclosure clearer and more explicit, the present disclosure will be further described in detail below with reference to the drawings and embodiments. It is to be understood that the embodiments described herein are merely illustrative of the present disclosure and are not intended to be limiting thereof.

The backlight module is one of the key components of the liquid crystal display panel and has the function of supplying sufficient brightness and uniformly distributed light sources so that it can display images normally. The so-called backlight is a kind of light source displayed for Liquid Crystal Display (LCD), and its luminous effect will directly affect a visual effect of the LCD module. Besides the performance of the backlight may directly affect the display quality of the LCD, the cost of the backlight accounts for 30-50% of the LCD module, and the power consumed accounts for 75% of the module. The backlight can be said to be a very important component of the LCD module.

Figure 1:
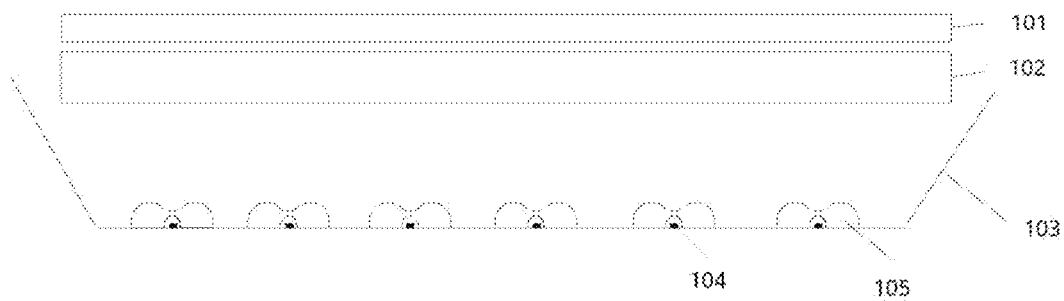
FIG. 1 is a schematic view showing a cross-sectional structure of an existing liquid crystal display backlight module.
Figure 2:
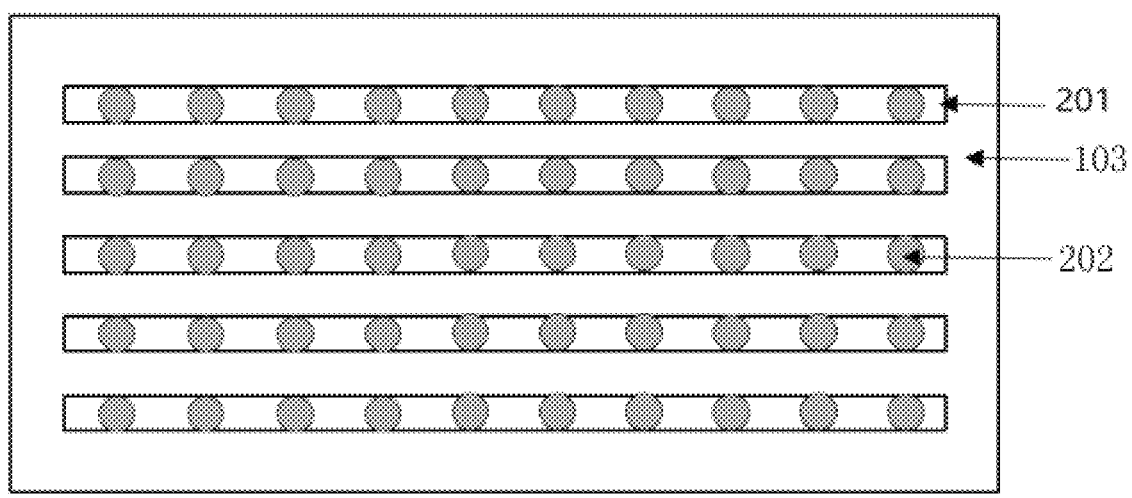
FIG. 2 is a schematic view of an LED light bar arrangement structure of an existing liquid crystal display backlight module.

FIG. 1 is a schematic view of a cross-sectional structure of a conventional liquid crystal display backlight module, and FIG. 2 is a schematic view of an LED light bar arrangement structure of the conventional liquid crystal display backlight module. As shown in FIG. 1 and FIG. 2, the liquid crystal display backlight module comprises an optical film group (101), a diffusion plate (102), a back plate (103), LED light bars (104) and lenses (105), wherein the LED light bars (104) comprise a printed circuit board (201) and LED lights (202), the printed circuit board (201) is uniformly distributed on the back plate (103), and the LED lights (202) are uniformly arranged on the printed circuit board (201). The light source used in the traditional direct-type backlight scheme is an LED white light source, namely the LED light arranged on the LED light bar (104) is a white LED light source. When the full-white LED light is adopted as the backlight of the backlight module, the generated high-brightness picture appears on display equipment with a low color gamut, such that the problems of picture color whitening, color distortion and obscure specific detail color may occur, and the energy consumption of the full-white LED light as the backlight is large.

Based on the problems of the existing liquid crystal display backlight module, the embodiment provides a backlight module capable of realizing high brightness and high color gamut display effect, wherein the backlight module comprises a back plate and a light source unit arranged on the back plate, the light source unit comprises a printed circuit board and a plurality of light source groups, the plurality of light source groups are arranged on the printed circuit board, and each light source group at least comprises a red light source, a green light source and a blue light source; the plurality of light source groups are divided into a plurality of regions, and each region is independently controlled. According to the embodiment, the plurality of light source groups is used as the backlight of the backlight module. The plurality of light source groups are divided into regions, and the display signals of the light source groups in each region are controlled through independent control switches, so that the backlight LED light source can be lighted regionally in high brightness and high color gamut region. And compared with a traditional LED full white field high brightness scheme, the disclosure can also greatly reduce energy consumption.

In some embodiments, a display device is further provided, comprising a display panel and a backlight module, wherein the backlight module comprises a back plate and a light source unit arranged on the back plate, the light source unit comprises a printed circuit board and a plurality of light source groups arranged on the printed circuit board, and each light source group at least comprises a red light source, a green light source and a blue light source; the plurality of light source groups are divided into a plurality of regions, and each region is independently controlled. According to the embodiment of the disclosure, the light source groups are divided into regions to independently control each region to realize a backlight region control function, so that the display device can consider color details when displaying a high-brightness picture. That is, in a high-brightness scene, the reproducibility of the color is not reduced, and the phenomenon of high-brightness distortion of the picture is avoided. And because of the color Local Dimming technology, it can also greatly improve the picture contrast and achieve energy-saving effects.

In some embodiments, each region includes at least one red light source, one green light source, and one blue light source. In some embodiments, the red light source is a red light LED chip; the green light source is a green light LED chip; the blue light source is a blue light LED chip, and the red light LED chip, the green light LED chip and the blue light LED chip are packaged into a whole to form the light source group. In the embodiment, the one light source group is a three-in-one single LED simultaneously comprising a red light LED chip, a green light LED chip and a blue light LED chip.

Figure 3:
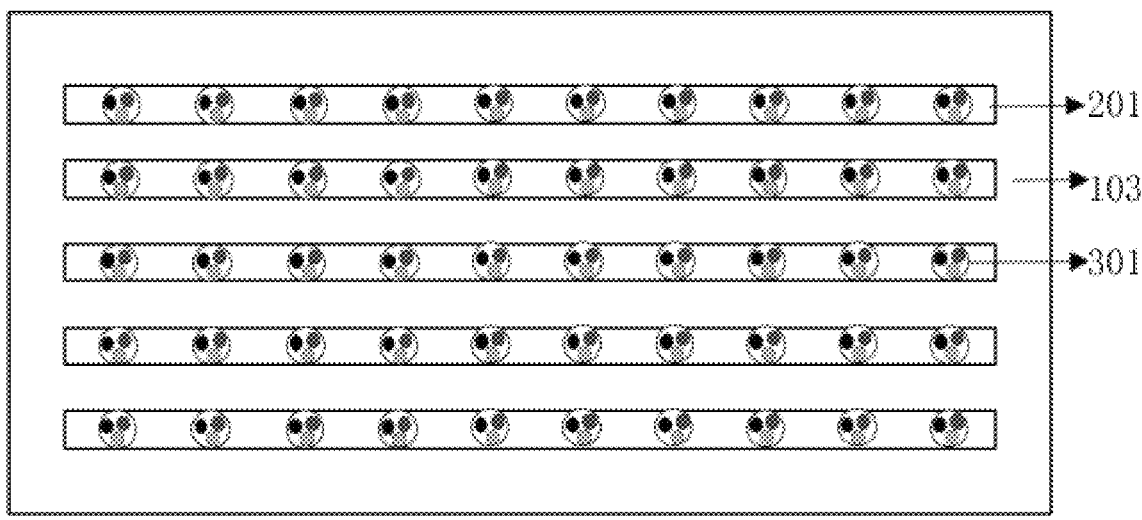
FIG. 3 is a schematic view showing the structure of a backlight module according to the present disclosure.
Figure 4:
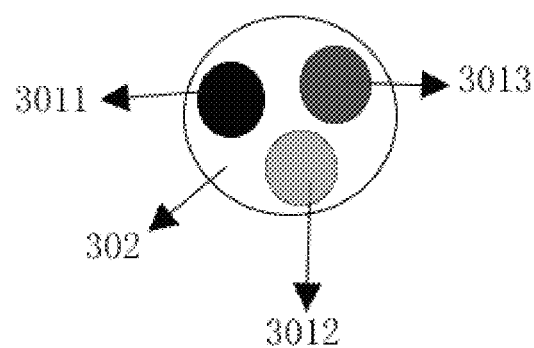
FIG. 4 is a schematic view showing an enlarged structure of the single light source group in FIG. 3.

In some embodiments, as shown in FIG. 3 and FIG. 4, the backlight module comprises a light source unit arranged on a back plate (103). The light source unit comprises a printed circuit board (201) and a light source group (301) arranged on the printed circuit board (201). The red light LED chip (3011), the green light LED chip (3012) and the blue light LED chip (3013) in the light source group are all provided with independent control switches. In the embodiment, the red light LED chip (3011), the green light LED chip (3012) and the blue light LED chip (3013) are all controlled by separate circuits. The current parameters of the separate circuits can be adjusted according to the required brightness and color, and the light source group can display pure white when the proper proportion is adjusted. By partitioning the plurality of light source groups and independently controlling the light source groups in the partitioned area, a color Local Dimming effect can be realized, and a backlight LED light source can be lighted regionally when high brightness and high color saturation are needed.

As shown in FIG. 4, the light source group (301) comprises an LED substrate (302) and a red light LED chip (3011), a green light LED chip (3012) and a blue light LED chip (3013) which are arranged on the LED substrate (302), wherein the connecting lines of the red light LED chip (3011), the green light LED chip (3012) and the blue light LED chip (3013) form a triangular.

In some embodiments, in order to achieve a high color gamut and high contrast display effect, a plurality of light source groups are divided into regions. In the present embodiment, each region comprises one light source group, that is, the number of the regions is equal to the number of light source groups; in the embodiment, the red light LED chip (3011), the green light LED chip (3012) and the blue light LED chip (3013) in each light source group are provided with independent control switches, and each chip can perform switch control according to different input signals. In some embodiments, when the display screen needs to display a red signal somewhere, the red light LED chip in the light source group in the region is on, thus forming a red Local Dimming effect.

In some embodiments, the number of divided regions may be selected according to actual needs. Taking the case where each region includes four light source groups as an example, when a region is required to display a red signal, the red light LED chips in the four light source groups in the region may be controlled to simultaneously illuminate and output a red signal.

In some embodiments, when the color gamut requirement of the display screen is not high, a white light source can be arranged between the light source groups at intervals according to the requirement, and the number and the setting positions of the white light sources can be adjusted according to the actual requirement. According to the embodiment, the white light sources are arranged between the light source groups at intervals, so that the display brightness can be increased and the cost can be reduced. In the embodiment, the white light source comprises an LED chip and a fourth packaging structure for packaging the LED chip, wherein the fourth packaging structure comprises a fourth packaging lens and a light conversion layer, and the fourth packaging structure is used for converting light emitted by the LED chip into white light; the LED chip in the white light source is a blue light LED chip or an ultraviolet light LED chip.

Figure 5:
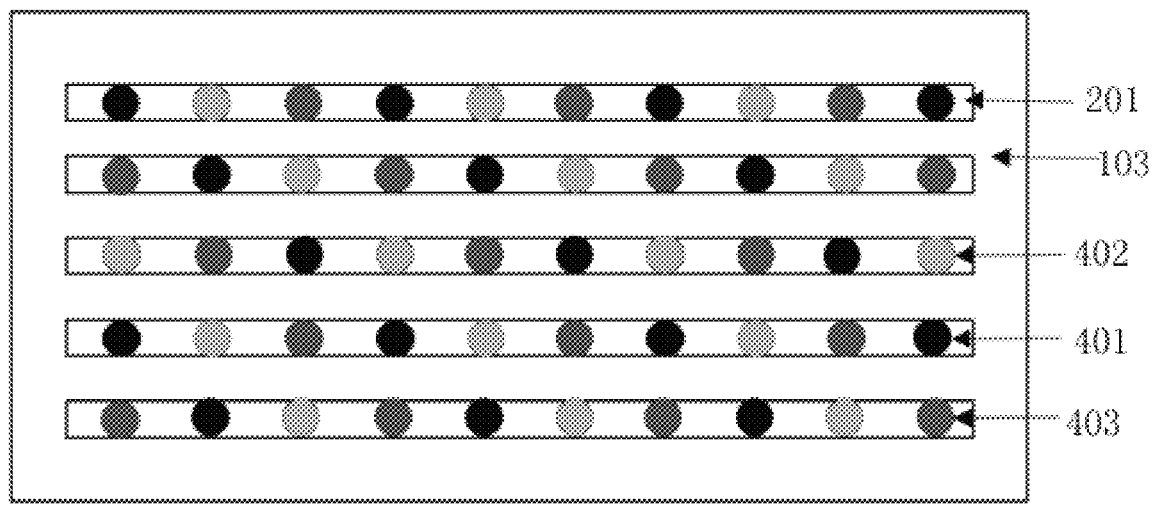
FIG. 5 is a schematic view showing the structure of another backlight module according to the present disclosure.

In some embodiments, as shown in FIG. 5, the backlight module comprises a light source unit arranged on a back plate (103), the light source unit bar comprises a printed circuit board (201) and a red light source (401), a green light source (402) and a blue light source (403) arranged on the printed circuit board (201), and the red light source (401), the green light source (402) and the blue light source (403) are provided with independent control switches; the red light source (401) comprises a red light LED chip and a first packaging structure for packaging the red light LED chip; the green light source (402) comprises a green light LED chip and a second packaging structure for packaging the green light LED chip; the blue light source (403) comprises a blue light LED chip and a third packaging structure for packaging the blue light LED chip, wherein one the red light source, one the green light source and one the blue light source form one the light source group. Likewise, the embodiment may also divide regions by dividing red light source (401), green light source (402), and blue light source (403) on the printed circuit board (201), each region includes at least one red light source (401), at least one green light source (402), and at least one blue light source (403). The red light source (401), the green light source (402) and the blue light source (403) in a partitioned area are independently controlled so that a color Local Dimming effect can be realized, and a backlight LED light source can be lighted regionally when high brightness and high color saturation are needed.

In some embodiments, the first packaging structure comprises a red light quantum dot material; the second packaging structure comprises a green light quantum dot material; the third packaging structure comprises a blue light quantum dot material. The red light quantum dot material, the green light quantum dot material and the blue light quantum dot material are independently selected from one of indium phosphide quantum dot, indium arsenide quantum dot, gallium arsenide quantum dot, zinc sulfide quantum dot, zinc selenide quantum dot or perovskite quantum dot materials, but are not limited thereto. The perovskite quantum dot comprises all-inorganic perovskite quantum dot and organic-inorganic hybrid perovskite quantum dot, and the chemical formula of the all-inorganic perovskite quantum dot is $CsPbX_3$ (x=Cl/Br/I); the chemical formula of the organic-inorganic hybrid perovskite quantum dot is $CH_3NH_3PbX_3$ (x=Cl/Br/I).

In some embodiments, the first packaging structure includes a first packaging lens; the second packaging structure includes a second packaging lens; the third packaging structure includes a third packaging lens.

In some embodiments, each region contains the same number of the red light source (401), green light source (402), and blue light source (403). For example, two light source groups (six lights) are arranged into one region that contains two red light sources (401), two green light sources (402) and two blue light sources (403). When a red signal is present therein, all red light LEDs simultaneously illuminate to output a red signal, thus forming a color Local Dimming effect.

In some embodiments, the red light source (401), the green light source (402) and the blue light source (403) arranged on the printed circuit board are sequentially arranged at intervals, and an arrangement of the red light source (401), the green light source (402) and the blue light source (403) on the printed circuit board is shown in FIG. 5. The back plate is provided with five transversely arranged printed circuit boards as shown in FIG. 5, wherein the first printed circuit board located at the topmost end is sequentially and cyclically arranged from left to right a red light source (401), a green light source (402) and a blue light source (403), the second printed circuit board located below the first printed circuit board is sequentially and cyclically arranged from left to right a blue light source (403), a red light source (401) and a green light source (402), and the third printed circuit board located below the second printed circuit board is sequentially and cyclically arranged from left to right a green light source (402), a blue light source (403) and a red light source (401); the LED arrangement sequence of the fourth printed circuit board below the third printed circuit board is consistent with the LED arrangement sequence of the first printed circuit board, and the LED arrangement sequence of the fifth printed circuit board below the fourth printed circuit board is consistent with the LED arrangement sequence of the second printed circuit board.

In some embodiments, each region may include two red light sources (401), one green light source (402), and one blue light source (403). When the display screen displays a red signal in a region, the two red light sources (401) in the region may be controlled to illuminate, and the green light source (402) and one blue light source (403) in the region may be controlled to be off. The red Local Dimming effect can now be displayed in the region.

In some embodiments, when the color gamut requirement of the display screen is not high, a white light source can be arranged between the light source groups at intervals according to the requirement, and the number and the setting positions of the white light source may be adjusted according to the actual requirement. The white light source can be arranged between the red light source and the green light source, between the green light source and the blue light source, or between the red light source and the blue light source. The arrangement of the white light source can not only increase the display brightness but also reduce the cost. According to the embodiment, the white light source is arranged between the light source groups at intervals, so that the display brightness can be increased and the cost can be reduced. In the embodiment, the white light source comprises an LED chip and a fourth packaging structure for packaging the LED chip, wherein the fourth packaging structure comprises a fourth packaging lens and a light conversion layer, and the fourth packaging structure is used for converting light emitted by the LED chip into white light; the LED chip in the white light source is a blue light LED chip or an ultraviolet light LED chip.

In some embodiments, the red light source comprises a blue light LED chip and a first packaging structure for packaging the blue light LED chip, wherein the first packaging structure is used for converting blue light emitted by the blue light LED chip into red light; the green light source comprises a blue light LED chip and a second packaging structure for packaging the blue light LED chip, and the second packaging structure is used for converting blue light emitted by the blue light LED chip into green light; the blue light source comprises a blue light LED chip and a third packaging structure for packaging the blue light LED chip, wherein one the red light source, one the green light source and one the blue light source form one the light source group.

In some embodiments, the first packaging structure includes a red light quantum dot material and a first packaging lens, the second packaging structure includes a green light quantum dot material and a second packaging lens, and the third packaging structure includes a blue light quantum dot material and a third packaging lens. In some embodiments, the red light source includes a blue light chip, a red light quantum dot material encasing the blue light chip, and a first packaging lens encasing the red light quantum dot material; the green light source comprises a blue light chip, a green light quantum dot material encasing the blue light chip and a second packaging lens encasing the green light quantum dot material; the blue light source comprises a blue light chip, a blue light quantum dot material encasing the blue light chip and a third packaging lens encasing the blue light quantum dot material. In the embodiment, the red light quantum dot material, the green light quantum dot material and the blue light quantum dot material are used as fluorescent powder, and light of corresponding colors can be emitted under the irradiation of the blue light chip. The quantum dot material has excellent high color gamut characteristics, and the red light source, the green light source and the blue light source of the embodiment can effectively improve the display color gamut of an image.

Figure 6:
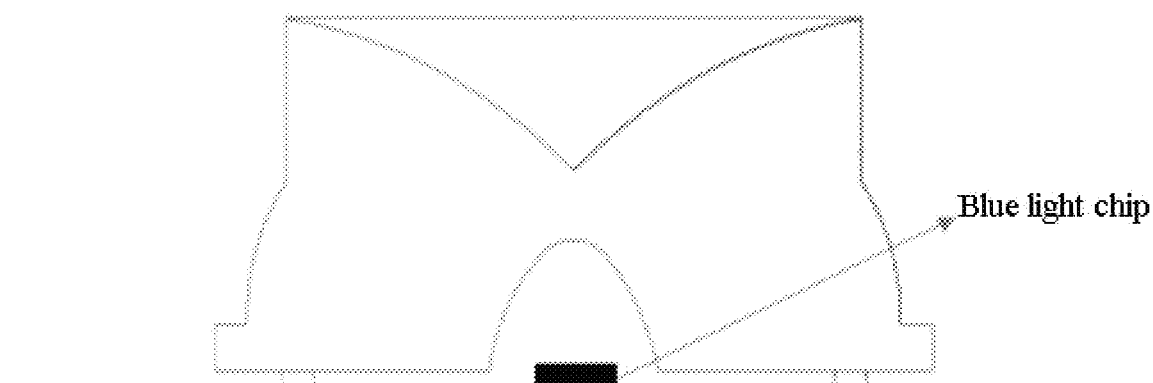
FIG. 6 is a schematic structural view of the principle of the quantum dot lens light source of the present disclosure.

In some embodiments, as shown in FIG. 6, a red light quantum dot material is incorporated into the first packaging lens to emit red light under blue light excitation. Similarly, a green quantum dot material is incorporated into the second packaging lens to correspondingly emit green light under blue light excitation, and a blue quantum dot material is incorporated into the third packaging lens to correspondingly emit blue light under blue light excitation. In the embodiment, the red light source, the green light source and the blue light source are all blue light chip excitation light sources, wherein the red light source is formed by doping a red light quantum dot material in a corresponding lens with the blue light chip excitation light source, the green light source is formed by doping a green light quantum dot material in a corresponding lens with the blue light chip excitation light source, and the blue light source is formed by doping a blue light quantum dot material in a corresponding lens with the blue light chip excitation light source.

In some embodiments, the red light source comprises an ultraviolet light LED chip and a first packaging structure for packaging the ultraviolet light LED chip, wherein the first packaging structure is used for converting light emitted by the ultraviolet light LED chip into red light; the green light source comprises an ultraviolet light LED chip and a second packaging structure for packaging the ultraviolet light LED chip, and the second packaging structure is used for converting light emitted by the ultraviolet light LED chip into green light; the blue light source comprises an ultraviolet light LED chip and a third packaging structure for packaging the ultraviolet light LED chip, and the third packaging structure is used for converting light emitted by the ultraviolet light LED chip into blue light; one red light source, one green light source and one blue light source form one light source group. In the embodiment, the red light source is formed by doping a red light quantum dot material in a corresponding lens with an ultraviolet light LED chip excitation light source, the green light LED is formed by doping a green light quantum dot material in a corresponding lens with an ultraviolet light LED chip excitation light source, and the blue light LED is formed by doping a blue light quantum dot material in a corresponding lens with an ultraviolet light LED chip excitation light source.

In some embodiments, the quantum dot material is independently selected from one of, but not limited to, indium phosphide quantum dot, indium arsenide quantum dot, gallium arsenide quantum dot, zinc sulfide quantum dot, zinc selenide quantum dot, or perovskite quantum dot materials. The perovskite quantum dot comprises all-inorganic perovskite quantum dot and organic-inorganic hybrid perovskite quantum dot, and the chemical formula of the all-inorganic perovskite quantum dot is $CsPbX_3$ (x=Cl/Br/I); the chemical formula of the organic-inorganic hybrid perovskite quantum dot is $CH_3NH_3PbX_3$ (x=Cl/Br/I).

In summary, the backlight module provided by the disclosure adopts a light source unit as a backlight, wherein the light source unit comprises a printed circuit board and a plurality of light source groups arranged on the printed circuit board, each light source group at least comprises a red light source, a green light source and a blue light source; the plurality of light source groups are divided into a plurality of regions, and each region is independently controlled. According to the disclosure, a plurality of light source groups are divided into a plurality of regions, and the regions are independently controlled, so that a color Local Dimming effect is realized, a backlight LED light source can be lighted regionally when high brightness and high color saturation are needed, and the energy consumption can be greatly reduced compared with a traditional LED white light full white field high brightness scheme.

It should be understood that the above descriptions are only embodiments of the present disclosure, and are not sufficient to limit the technical solutions of the present disclosure. For those of ordinary skills in the art, within the spirit and principle of the present disclosure, additions, deletions, substitutions, changes or improvements can be made based on the above description, and all the technical solutions after these additions, deletions, substitutions, changes or improvements shall belong to the scope of the appended claims of the disclosure.

What is claimed is:

1. A light source unit, wherein the light source unit comprises a printed circuit board and a plurality of light source groups, the plurality of light source groups are arranged on the printed circuit board, and each of the plurality of light source groups at least comprises a red light source, a green light source and a blue light source; the plurality of light source groups are divided into a plurality of regions, and each of the plurality of regions is independently controlled, and wherein the red light source comprises a red light LED chip and a first packaging structure for packaging the red light LED chip; the green light source comprises a green light LED chip and a second packaging structure for packaging the green light LED chip; the blue light source comprises a blue light LED chip and a third packaging structure for packaging the blue light LED chip, and one of the red light sources, one of the green light sources and one of the blue light sources form one of the light source groups.

2. The light source unit according to claim 1, wherein each of the regions comprises at least one of the red light sources, one of the green light sources and one of the blue light sources.

3. The light source unit according to claim 1, wherein the red light source, the green light source and the blue light source are provided with independent control switches.

4. The light source unit according to claim 1, wherein the first packaging structure comprises a red light quantum dot material; the second packaging structure comprises a green light quantum dot material; the third packaging structure comprises a blue light quantum dot material; the red light quantum dot material, the green light quantum dot material and the blue light quantum dot material are independently selected from the group consisting of indium phosphide quantum dot, indium arsenide quantum dot, gallium arsenide quantum dot, zinc sulfide quantum dot, zinc selenide quantum dot and perovskite quantum dot materials.

5. The light source unit according to claim 1, wherein the red light source, the green light source and the blue light source are sequentially arranged on the printed circuit board at intervals.

6. The light source unit according to claim 1, wherein the first packaging structure further comprises a first packaging lens; the second packaging structure further comprises a second packaging lens; the third packaging structure further comprises a third packaging lens.

7. The light source unit according to claim 1, wherein further comprising a white light source disposed on the printed circuit board between the light source groups.

8. The light source unit according to claim 7, wherein the white light source comprises an LED chip and a fourth packaging structure for packaging the LED chip, wherein the fourth packaging structure comprises a fourth packaging lens and a light conversion layer, and the fourth packaging structure is used for converting light emitted by the LED chip into white light; the LED chip of the white light source is a blue light LED chip or an ultraviolet light LED chip.

9. A backlight module, wherein the backlight module comprises a back plate and a light source unit, wherein the light source unit is arranged on the back plate;

the light source unit comprises: a printed circuit board and a plurality of light source groups, the plurality of light source groups are arranged on the printed circuit board, and each of the plurality of light source groups at least comprises a red light source, a green light source and a blue light source; the plurality of light source groups are divided into a plurality of regions, and each of the plurality of regions is independently controlled, and wherein the red light source comprises a red light LED chip and a first packaging structure for packaging the red light LED chip; the green light source comprises a green light LED chip and a second packaging structure for packaging the green light LED chip; the blue light source comprises a blue light LED chip and a third packaging structure for packaging the blue light LED chip, and one of the red light sources, one of the green light sources and one of the blue light sources form one of the light source groups.

10. A display device, comprising a display panel and the backlight module of claim 9 under the display panel.

* * * * *